United States Patent
McGregor

(10) Patent No.: US 9,041,102 B2
(45) Date of Patent: May 26, 2015

(54) POWER TRANSISTOR AND ASSOCIATED METHOD FOR MANUFACTURING

(75) Inventor: Joel M. McGregor, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 187 days.

(21) Appl. No.: 13/530,276

(22) Filed: Jun. 22, 2012

(65) Prior Publication Data

US 2013/0341715 A1    Dec. 26, 2013

(51) Int. Cl.
*H01L 29/66* (2006.01)
*H01L 29/40* (2006.01)
*H01L 29/78* (2006.01)
*H01L 29/06* (2006.01)
*H01L 29/08* (2006.01)

(52) U.S. Cl.
CPC ........ *H01L 29/402* (2013.01); *H01L 29/66659* (2013.01); *H01L 29/66719* (2013.01); *H01L 29/7816* (2013.01); *H01L 29/7835* (2013.01); *H01L 29/0619* (2013.01); *H01L 29/0634* (2013.01); *H01L 29/0692* (2013.01); *H01L 29/0696* (2013.01); *H01L 29/0847* (2013.01); *H01L 29/086* (2013.01); *H01L 29/0878* (2013.01)

(58) Field of Classification Search
CPC ......... H01L 23/58; H01L 29/66; H01L 29/76; H01L 29/94; H01L 29/402; H01L 29/42368; H01L 29/0653; H01L 29/66681; H01L 29/7835
USPC ....................................................... 257/336
See application file for complete search history.

(56) References Cited

U.S. PATENT DOCUMENTS

| | | | |
|---|---|---|---|
| 2002/0079521 A1* | 6/2002 | Lin | 257/288 |
| 2007/0069308 A1* | 3/2007 | Ko | 257/401 |
| 2009/0256199 A1* | 10/2009 | Denison et al. | 257/343 |
| 2010/0173458 A1* | 7/2010 | You et al. | 438/200 |
| 2011/0115018 A1 | 5/2011 | McGregor | |
| 2013/0020632 A1 | 1/2013 | Disney | |

* cited by examiner

*Primary Examiner* — Andy Huynh
*Assistant Examiner* — Sitaramarao S Yechuri
(74) *Attorney, Agent, or Firm* — Perkins Coie LLP

(57) ABSTRACT

The present disclosure discloses a lateral transistor and associated method for making the same. The lateral transistor comprises a gate formed over a first portion of a thin gate dielectric layer, and a field plate formed over a thick field dielectric layer and extending atop a second portion of the thin gate dielectric layer. The field plate is electrically isolated from the gate by a gap overlying a third portion of the thin gate dielectric layer and is electrically coupled to a source region. The lateral transistor according to an embodiment of the present invention may have reduced gate-to-drain capacitance, low specific on-resistance, and improved hot carrier lifetime.

10 Claims, 4 Drawing Sheets

POWER TRANSISTOR AND ASSOCIATED METHOD FOR MANUFACTURING

TECHNICAL FIELD

This disclosure relates generally to semiconductor devices, and particularly but not exclusively relates to metal-oxide semiconductor (MOS) transistors.

BACKGROUND

Power transistors, such as double diffused metal-oxide semiconductor (DMOS) transistors are widely used in various power management applications, including used as switching elements in power supplies for industrial and consumer electronic devices. A power supply usually refers to a device or a system that supplies electrical or other types of energy to a load or a group of loads. A power supply comprising a power transistor switched ON and OFF at a relative high rate in response to control signals to convert a supply voltage into a desired output voltage is generally referred to as a switched-mode power supply, switching-mode power supply or SMPS. The available switching rate of the power transistor consists one of the factors that influent the power conversion efficiency, the size and the cost of the power supply. The higher the switching rate of the power transistor is available, the higher the switching frequency of the power supply may achieve, thereby, the smaller in size of the components for driving the power transistor, the lower in power consumption and the lower in manufacturing cost of the power supply.

A power transistor may generally comprise a gate, a drain, and a source lying in a semiconductor substrate. The gate regulates the conduction and blocking of a channel region in the substrate to control a current flow between the drain and the source. Take a lateral DMOS power transistor for example, the gate may overlie a gate dielectric having a thin portion over the channel region and part of a drift region, and a thick portion over an additional part of the drift region. The gate may be continuously formed over the surface of the gate dielectric, including over at least part of the thick portion of the gate dielectric. The thick portion of the gate dielectric can help to reduce electric field in the gate region, thereby supporting high drain-to-gate voltage, advantageously increasing the breakdown voltage of the DMOS power transistor. However, since the continuous gate extends over at least part of the thick portion of the gate dielectric, the drain-to-gate capacitance of the power transistor is increased, making the gate need more time to be charged and discharged for turning the transistor on and off, thereby slowing the switching rate of the power transistor.

Apart from a relatively high breakdown voltage, a relatively low on resistance, a relatively low drain-to-gate capacitance for supporting a relatively high switching rate, a thinner gate dielectric and/or an improved hot carrier lifetime are also desired for a power transistor.

SUMMARY

In view of the above requirements, there has been provided, in accordance with an embodiment of the present disclosure, a lateral transistor, comprising: a semiconductor layer of a first conductivity type; a source region of a second conductivity type opposite to the first conductivity type in the semiconductor layer; a drain region of the second conductivity type in the semiconductor layer separated from the source region; a first well region of the second conductivity type surrounding the drain region and separated from the source region; a thin gate dielectric layer positioned atop the semiconductor layer between the source region and the first well region and extending atop a first portion of the first well region; a thick field dielectric layer positioned atop a second portion of the first well region between the drain region and the thin gate dielectric layer, wherein the thick field dielectric layer is thicker than the thin gate dielectric layer; a gate positioned atop a first portion of the thin gate dielectric layer near the source region side; and a field plate overlying at least a portion of the thick field dielectric layer and extending atop a second portion of the thin gate dielectric layer, wherein the field plate is electrically isolated from the gate by a gap overlying a third portion of the thin gate dielectric layer, and wherein the gap is filled with a dielectric material, and wherein the field plate is electrically coupled to the source region.

In addition, there has been provided, in accordance with an embodiment of the present disclosure, a method for forming a lateral transistor, comprising: providing a semiconductor layer of a first conductivity type; forming a first well region of a second conductivity type opposite to the first conductivity type in the semiconductor layer; forming a thick field dielectric layer overlying a first portion of the first well region and exposing a second portion and a third portion of the first well region, wherein the second portion and the third portion are separated by the first portion; forming a thin gate dielectric layer having at least a portion overlying the second portion of the first well region, wherein the thin gate dielectric layer is in connection with the thick field dielectric layer, and wherein the thick field dielectric layer is thicker than the thin gate dielectric layer; forming a gate atop a first portion of the thin gate dielectric layer; forming a field plate overlying at least a portion of the thick field dielectric layer and extending atop a second portion of the thin gate dielectric layer, wherein the field plate is electrically isolated from the gate by a gap overlying a third portion of the thin gate dielectric layer; forming a drain region of the second conductivity type in the third portion of the first well region and forming a source region of the second conductivity type in the semiconductor layer beside the gate; and coupling the field plate to the source region.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down," "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
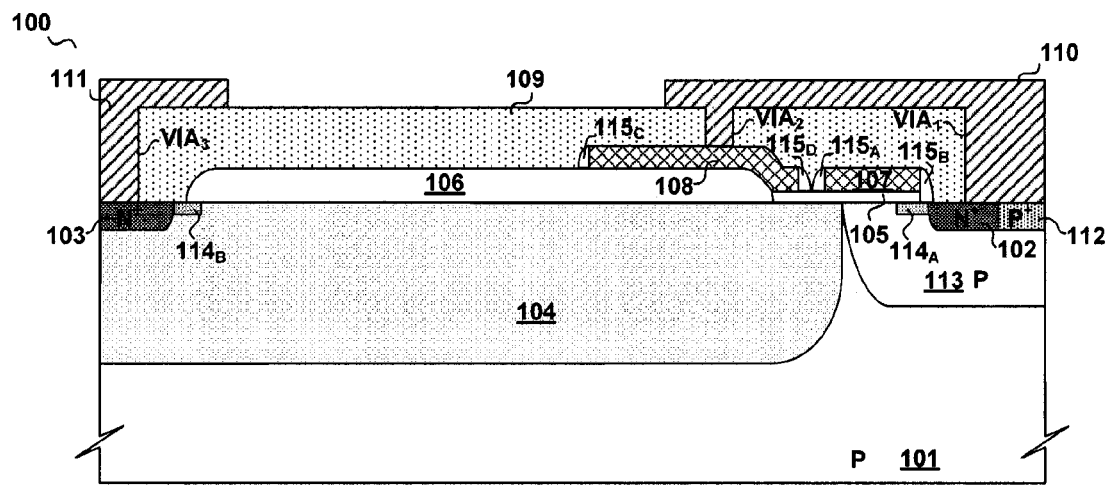
FIG. 1 illustrates schematically a cross-sectional view of a lateral transistor 100 in accordance with an embodiment of the present invention.

FIG. 1 illustrates schematically a cross-sectional view of a lateral transistor 100 in accordance with an embodiment of the present invention. In the example of FIG. 1, the lateral transistor 100 comprises a semiconductor layer 101 of a first conductivity type (e.g. P-type in FIG. 1); a source region 102 of a second conductivity type (e.g. N-type in FIG. 1) opposite to the first conductivity type in the semiconductor layer 101, wherein the source region 102 may have a heavy dopant concentration, for example, higher than $1\times10^{19}$ cm$^{-3}$; a drain region 103 of the second conductivity type (e.g. an N$^+$ region in FIG. 1) in the semiconductor layer 101 separated from the source region 102, wherein the drain region 103 may have a heavy dopant concentration, for example, higher than $1\times10^{19}$ cm$^{-3}$; a first well region 104 of the second conductivity type surrounding the drain region 103, extending towards the source region 102 and separated from the source region 102; a thin gate dielectric layer 105 positioned atop the semiconductor layer 101 between the source region 102 and the first well region 104 and extending atop a first portion of the first well region 104; a thick field dielectric layer 106 positioned atop a second portion of the first well region 104 between the drain region 103 and the thin gate dielectric layer 105, wherein the thick field dielectric layer 106 is thicker than the thin gate dielectric layer 105; a gate 107 positioned atop a first portion of the thin gate dielectric layer 105 near the source region 102 side; and a field plate 108 overlying at least a portion of the thick field dielectric layer 106 and extending atop a second portion of the thin gate dielectric layer 105, wherein the field plate 108 is electrically isolated from the gate 107 by a gap overlying a third portion of the thin gate dielectric layer 105, and wherein the gap is filled with a dielectric material, and wherein the field plate 108 is electrically coupled to the source region 102.

In the exemplary embodiment shown in FIG. 1, the lateral transistor 100 may comprise an N-channel MOS transistor. When the lateral transistor 100 is turned ON, an inversion layer of the second conductivity type (e.g. N-type in the example of FIG. 1) is generated in the first-conductivity-type semiconductor layer under the thin gate dielectric layer 105 between the first well region 104 and the source region 102, to provide a channel through which current can flow from the drain region 103 to the source region 102. The portion of the first-conductivity-type semiconductor layer under the thin gate dielectric layer 105 where the inversion layer is generated in the transistor ON-state is generally referred to as a channel region. The first well region 104 surrounding the drain region 103 and under the thick field dielectric layer 106 may be considered as a drift region through which active carriers drift from the source region 102 to the drain region 103 during the transistor ON-state. In addition, the first well region 104 under the gate dielectric layer 105 may be referred to as a transition region which provides an active carrier drift path from the channel region to the drift region during the transistor ON-state. The drift region and the transition region account for most of the transistor on-resistance.

Generally, increasing the doping concentration within the drift region and the transition region may help to decrease the on-resistance of the lateral transistor 100. However, increasing the doping concentration within the drift region and the transition region may cause the drift region and the transition region more difficult to be completely depleted, resulting in a decrease in breakdown voltage. Nevertheless, for the exemplary lateral transistor 100 illustrated in FIG. 1, the thick field dielectric layer 106 and the field plate 108 may advantageously help to capacitively deplete the drift region and the transition region. Therefore, the first well region 104 (the drift region and the transition region) may have an increased doping concentration than would be possible without the field plate 108, thereby reducing the on-resistance while retaining the breakdown voltage of the lateral transistor 100. In addition, the field plate 108 coupled to the source region 102 may help to establish a uniform electric field distribution in the first well region 105, alleviating the formation of high electric field locations in the first well region 105, thereby improving the breakdown voltage of the lateral transistor 100. Also, the field plate 108 covering the thick field dielectric layer 106 and a second portion of the thin gate dielectric layer 105 may help to drop a high gate-to-drain voltage, shielding the thin gate dielectric layer 105 from being damaged by too high a voltage. Furthermore, in the exemplary embodiment shown in FIG. 1, the thick field dielectric layer 106 may allow lower on-resistance and area product (generally denoted by $R_{on}*A$ and referred to as the specific on-resistance) for that the silicon surface underneath the field plate 108 and the thick field dielectric layer 106 is flat.

In comparison with a conventional lateral transistor having a field plate connected to the gate (e.g. a continuous gate extending over a portion of the thick dielectric layer), the field plate 108 of the lateral transistor 100 is electrically isolated from the gate 107, thus, the drain-to-gate capacitance of the lateral transistor 100 is reduced. Moreover, the gap isolating the field plate 108 and the gate 107 is positioned over the thin gate dielectric layer 105, thus the gate 107 is completely over the thin gate dielectric layer 105, thereby further reducing the drain-to-gate capacitance of the lateral transistor 100. Therefore, the lateral transistor 100 may have improved switching rate, thereby reducing power loss during switching and reducing die size when applied in various integrated circuits. In addition, since the field plate 108 coupled to the source region (which is normally grounded) may help to direct the on-current away from the thin gate dielectric layer 105, the hot carrier lifetime of the lateral transistor 100 may be improved. In the embodiment shown in FIG. 1, the field plate 108 extends atop a second portion of the thin gate dielectric layer 105, thereby further improving the hot carrier lifetime.

The lateral transistor 100 shown in FIG. 1 is just for purpose of illustration and should not be considered to be limiting.

According to various embodiments of the present invention, the semiconductor layer 101 of the first conductivity type may be provided and formed on other layers (not shown in FIG. 1) that are compatible with various features of various embodiments of the lateral transistor 100 and are compatible with other aspects of the device manufacturing process. For example, in one embodiment, the semiconductor layer 101 may comprise a semiconductor substrate of the first conductivity type; in other embodiment, the semiconductor layer 101 may be provided and formed on a semiconductor substrate of the first conductivity type; in other embodiment, the semiconductor layer 101 may be provided on an epitaxial layer of the first conductivity type which may be formed on a semiconductor substrate of the first conductivity type; in still other embodiment, the semiconductor layer 101 may even be provided and formed on a silicon dioxide (SOI) layer which may be formed on a semiconductor substrate of the second conductivity type. Various embodiments of the present invention intend to cover any equivalent modifications and variations wherein the semiconductor layer 101 is provided and the lateral transistor 100 is manufactured on the semiconductor layer 101.

In one embodiment, the thin gate dielectric layer 105 may comprise a thin gate oxide layer (i.e. a thin silicon dioxide layer). In other embodiment, the thin gate dielectric layer 105 may comprise other isolation materials that are compatible with other aspects of the device manufacturing process.

In one embodiment, the thick field dielectric layer 106 may comprise a thick field oxide layer (i.e. a thick silicon dioxide layer). In other embodiment, the thick field dielectric layer 106 may comprise other isolation materials that are compatible with other aspects of the device manufacturing process.

In one embodiment, the gate 107 may comprise doped poly-silicon. In other embodiment, the gate 107 may comprise other conductive materials (e.g., metals, other semiconductors, semi-metals, and/or combinations thereof) that are compatible with other aspects of the device manufacturing process. Thus, the term "poly-silicon" is intended to include such other materials and material combinations in addition to silicon.

In one embodiment, the field plate 108 may comprise the same material as the gate 107. In other embodiment, the field plate 108 may comprise any other conductive materials such as doped poly-silicon, metals, other semiconductors, semi-metals, and/or combinations thereof.

In one embodiment, the lateral transistor 100 may further comprise: an interlayer dielectric layer (ILD) 109, a source electrode 110 coupled to the source region 102 and the field plate 108 through, for example, first and second vias $VIA_1$ and $VIA_2$ in the ILD 109; a drain electrode 111 coupled to the drain region 103 through for example a third via $VIA_3$ in the ILD 109; and a gate electrode (not shown in FIG. 1) coupled to the gate 107.

In one embodiment, the gap isolating the gate 107 and the field plate 108 may be filled with the same material as that for forming the ILD 109.

In one embodiment, the lateral transistor 100 may further comprise a body contact region 112 of the first conductivity type with a heavy dopant concentration (e.g. a $P^+$ body contact region in FIG. 1) adjacent to the source region 102. The body contact region 112 may be connected to the source region 102 and coupled to the source electrode 110, as shown in FIG. 1. The body contact region may help to enhance electrical connection of the source region 102 to the semiconductor layer 101.

In one embodiment, the lateral transistor 100 may further comprise a second well region 113 of the first conductivity type (e.g. a P-type body region 113 illustrated in the example of FIG. 1) surrounding the source region 102 and extending below a portion of the gate 107. In the embodiment where the body contact region 112 is formed, the body contact region 112 is also enclosed by the second well region 113.

In one embodiment, the lateral transistor 100 may further comprise a first lightly-doped region $114_A$ of the second conductivity type (e.g. an NLDS region in FIG. 1) beside and in contact with the source region 203. Similarly, in yet other embodiment, the lateral transistor 100 may further comprise a second lightly doped region $114_B$ of the first conductivity type (e.g. an NLDD region in FIG. 1) beside and in contact with the drain region 103. The first lightly-doped region $114_A$ and the second lightly-doped region $114_B$ may help to reduce short-channel effects of the lateral transistor 100.

In one embodiment, the lateral transistor 100 may further comprise sidewall spacers $115_A$~$115_B$ at each side of the gate 107 and the field plate 108. The sidewall spacers $115_A$~$115_B$ allow for ease of fabrication by facilitating alignment of source/drain region implantation steps.

Figure 2:
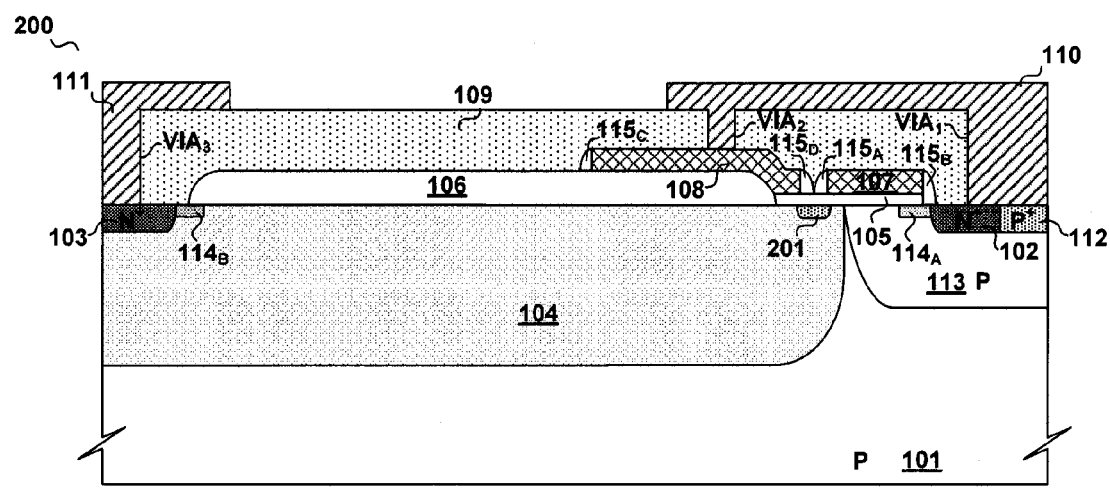
FIG. 2 illustrates schematically a cross-sectional view of a lateral transistor 200 in accordance with another embodiment of the present invention.

FIG. 2 illustrates schematically a cross-sectional view of a lateral transistor 200 in accordance with another embodiment of the present invention. Components or structures in the lateral transistor 200 with substantially the same functions as those of the lateral transistor 100 are identified by the same reference labels as used in the lateral transistor 100 for the sake of simplicity. As illustrated in FIG. 2, the lateral transistor 200 may further comprise a shallow lightly doped region 201 of the first conductivity type located in the first well region 104 underneath the gap between the gate 107 and the field plate 108. The shallow lightly doped region 201 of the first conductivity type may help to alleviate/prevent a buildup of an inversion layer of holes (if the lateral transistor 200 comprise an N-channel transistor)/electrons (if the lateral transistor 200 comprise a P-channel transistor) under the field plate 108 over the second portion of the thin gate dielectric layer 105 when the lateral transistor 200 is turned on, thereby reducing/preventing the formation of an electric field under the second portion of the thin gate dielectric layer 105, which would otherwise draw an on-current toward the second portion of the thin gate dielectric layer 105, resulting in damage to the thin gate dielectric layer 105 and a decrease in hot carrier lifetime of the lateral transistor 200. Therefore, the shallow lightly doped region 201 on the one hand may improve the hot carrier lifetime of the lateral transistor 200, and on the other may allow the lateral transistor 200 have a thinner gate dielectric layer 105 than would be without the shallow lightly doped region 201.

Figure 3A:
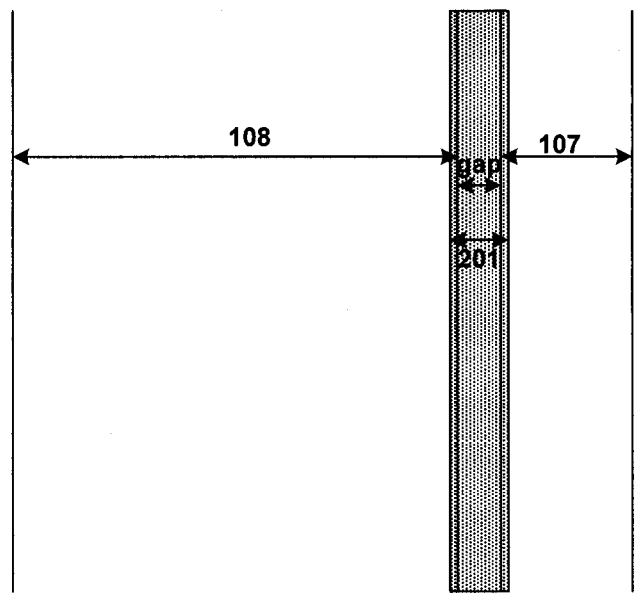
FIG. 3A illustrates schematically a top plan view of a continuously formed shallow lightly doped region underneath the gap between the gate and the field plate in accordance with an embodiment of the present invention.

In one embodiment, the shallow lightly doped region 201 may be continuously formed in the first well region 104 underneath the gap between the gate 107 and the field plate 108 in the direction perpendicular with the cross-section of FIG. 2. FIG. 3A illustrates schematically a top plan view of the continuously formed shallow lightly doped region 201.

Figure 3B:
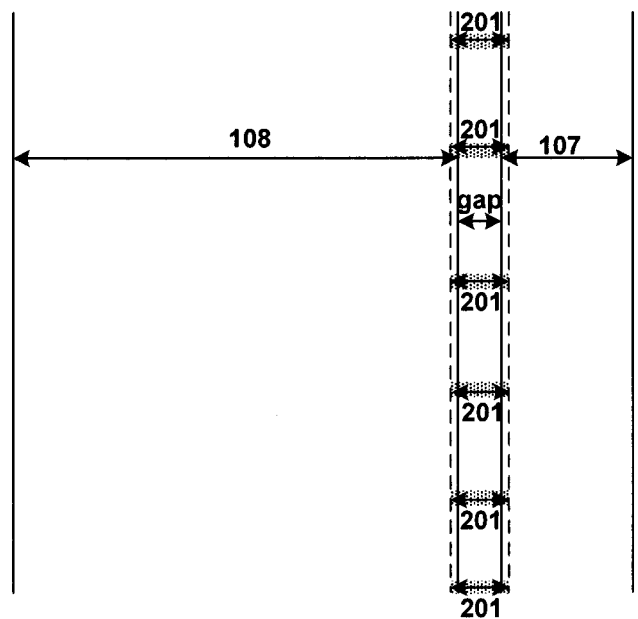
FIG. 3B illustrates schematically a top plan view of a discontinuously formed shallow lightly doped region underneath the gap between the gate and the field plate in accordance with another embodiment of the present invention.

In another embodiment, the shallow lightly doped region 201 may be discontinuously formed in the first well region 104 underneath the gap between the gate 107 and the field plate 108 in the direction perpendicular with the cross-section of FIG. 2. FIG. 3B illustrates schematically a top plan view of the discontinuously formed shallow lightly doped region 201.

The advantages of the various embodiments of the present invention are not confined to those described above. These and other advantages of the various embodiments of the present invention will become more apparent upon reading the whole detailed descriptions and studying the various figures of the drawings.

Figure 4:
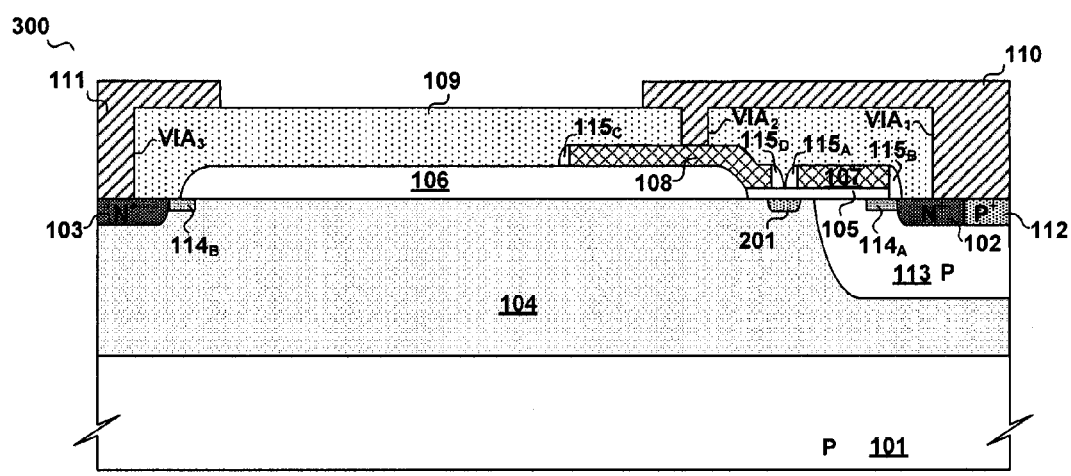
FIG. 4 illustrates schematically a cross-sectional view of a lateral transistor 300 in accordance with another embodiment of the present invention.

One having ordinary skill in the art should appreciate that the lateral transistors 100 and 200 are just shown for purpose of illustration and may be modified without detracting from the merits of the present invention. As an example, a lateral transistor 300 in accordance with another exemplary embodiment of the present invention is illustrated in FIG. 4. Components or structures in the lateral transistor 300 with substantially the same functions as those of the lateral transistors 100 and 200 are identified by the same reference labels as used in the lateral transistors 100 and 200 for the sake of simplicity. As illustrated in FIG. 4, the first well region 104 may extend below the source region 102 side and enclosing the source region 102. In this case, the source region 102, the body contact region 112 and the second well region 113 are all formed in the first well region 104, wherein the first well region 104 is separated from the source region 102 by the second well region 113 formed surrounding the source region 102. All other components shown in FIG. 4 are as previously explained in connection with FIGS. 1 through 3B.

Figure 5:
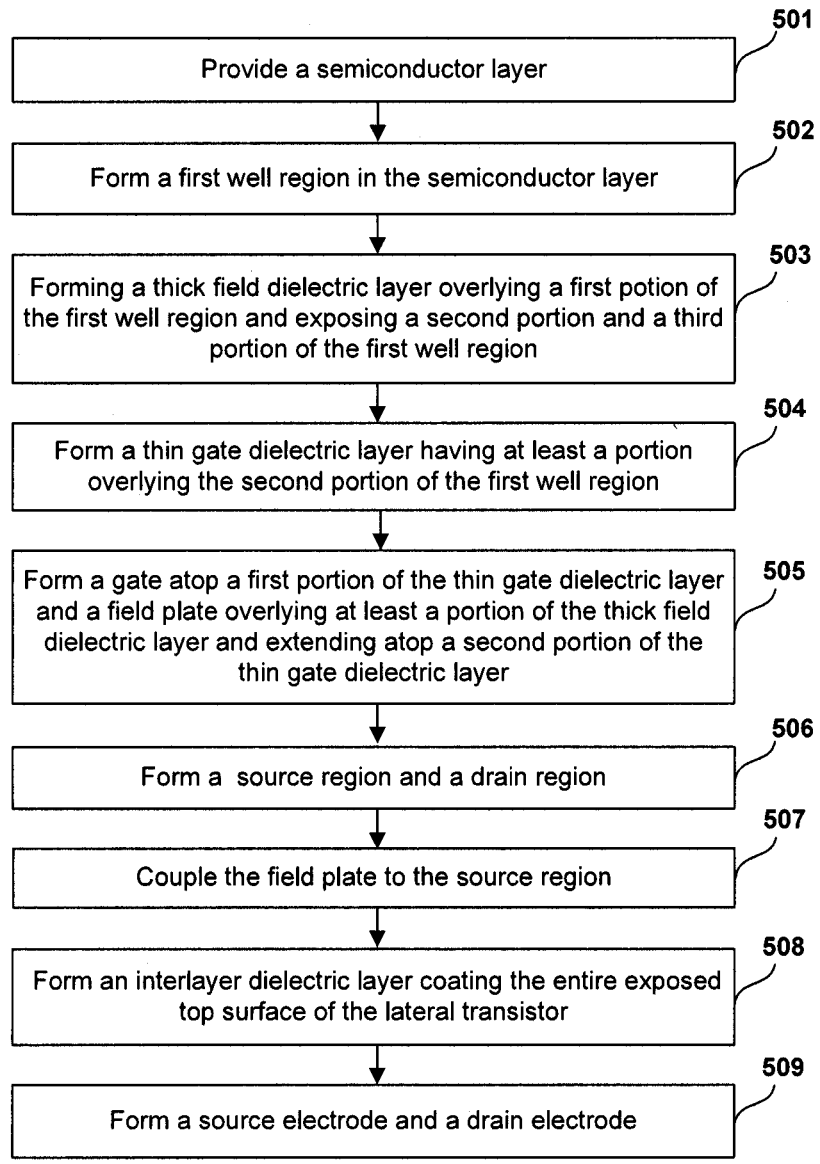
FIG. 5 shows a flow chart illustrating a method of forming a lateral transistor in accordance with an embodiment of the present invention.

FIG. 5 shows a flow chart illustrating a method of forming a lateral transistor in accordance with an embodiment of the present invention. The method comprises: providing a semiconductor layer of a first conductivity type at step 501; forming a first well region of a second conductivity type opposite to the first conductivity type in the semiconductor layer at step 502; forming a thick field dielectric layer overlying a first portion of the first well region and exposing a second portion and a third portion of the first well region at step 503, wherein the second portion and the third portion are separated by the first portion; forming a thin gate dielectric layer having at least a portion overlying the second portion of the first well region at step 504, wherein the thin gate dielectric layer is in connection with the thick field dielectric layer, and wherein the thick field dielectric layer is thicker than the thin gate dielectric layer; forming a gate atop a first portion of the thin gate dielectric layer and a field plate overlying at least a portion of the thick field dielectric layer and extending atop a second portion of the thin gate dielectric layer at step 505, wherein the field plate is electrically isolated from the gate by a gap overlying a third portion of the thin gate dielectric layer; forming a drain region of the second conductivity type in the third portion of the first well region and forming a source region of the second conductivity type in the semiconductor layer beside the gate at step 506; and coupling the field plate to the source region at step 507, In one embodiment, in order to reduce processing steps and cost, the field plate may be formed using a same layer that is used to form the gate. For example, at the step 505, a lightly-doped or undoped layer of polysilicon may be formed on the thin and thick gate dielectric layers, and then may be doped with a first dose of N-type and/or P-type impurities (e.g. boron with a dose in the range of $1\times10^{14}$ cm$^{-3}$ to $1\times10^{15}$ cm$^{-3}$) to obtain a desired sheet resistance (e.g. 1 to 10 kohms/square) for the field plate. Subsequently, the polysilicon layer may be patterned and etched to form the field plate and the gate, and the gate may then be doped with a second dose of higher concentration of N-type and/or P-type impurities, for example using the source/drain region implant.

In one embodiment, sidewall spacers may be formed at each side of the gate and the field plate at the step 506 prior to forming the source and drain regions. In one embodiment, the source region may then be formed by implanting dopants using the sidewall spacer of the gate for alignment. In one embodiment, the drain region may be formed by implanting dopants using the sidewall spacer of the field plate for alignment.

In one embodiment, the method of forming the lateral transistor may further comprise forming a first lightly doped region of the first conductivity type (see e.g. the NLDS region $114_A$ in FIG. 1) beside and in contact with the source region at the step 506, wherein the first lightly doped region extends below the gate. Similarly, in another embodiment, the method of forming the lateral transistor may further comprise forming a second lightly doped region of the first conductivity type (see e.g. the NLDD region $114_B$ in FIG. 1) beside and in contact with the drain region at the step 506, wherein the second lightly doped region extends below the thick gate insulation layer.

In one embodiment, the method of forming the lateral transistor may further comprise forming an interlayer dielectric layer coating the entire exposed top surface of the lateral transistor at step 508; and forming a source electrode and a drain electrode on top of the interlayer dielectric layer at step 509, wherein the source electrode is coupled to the source region and the field plate, e.g. a plurality of vias (for example VIA$_1$ and VIA$_2$ as illustrated in FIGS. 1, 2 and 4) in the interlayer dielectric layer, and wherein the drain electrode is coupled to the drain region. In one embodiment, a gate electrode coupled to the gate is also formed at the step 509.

In one embodiment, the method of forming the lateral transistor may further comprise forming a body contact region of the first conductivity type with a heavy dopant concentration abutting the source region at the step 506, wherein the body contact region is connected to the source region and coupled to the source electrode.

In one embodiment, the method of forming the lateral transistor may further comprise forming a second well region of the first conductivity type prior to forming the source region and the body contact region at the step 506, wherein the second well region encloses the source region and the body contact region and separates the source region from the first well region.

In one embodiment, the method of forming the lateral transistor may further comprise forming a shallow lightly doped region of the first conductivity type in the first well region underneath the gap between the gate and the field plate at the step 506. In one embodiment, the shallow lightly doped region may be formed prior to forming the source and drain regions. In another embodiment, the shallow lightly doped region may be formed after forming the source and drain regions. In one embodiment, the shallow lightly doped region may be continuously formed in the first well region underneath the gap between the gate and the field plate (See e.g. FIG. 3A). In another embodiment, the shallow lightly doped region may be discontinuously formed in the first well region underneath the gap between the gate and the field plate (See e.g. FIG. 3B).

Methods and processes of forming a high-voltage transistor described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

Although the present disclosure takes an N-channel lateral transistor for example to illustrate and explain the structures of a lateral transistor according to various embodiments of the present invention, but this is not intended to be limiting and persons of skill in the art will understand that the structures and principles taught herein also apply to P-channel high-voltage transistors and to other types of semiconductor materials and devices as well.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

I claim:

1. A lateral transistor, comprising:
a semiconductor layer of a first conductivity type;
a source region of a second conductivity type opposite to the first conductivity type in the semiconductor layer;
a drain region of the second conductivity type in the semiconductor layer separated from the source region;
a first well region of the second conductivity type surrounding the drain region and separated from the source region;
a thin gate dielectric layer positioned atop the semiconductor layer between the source region and the first well region and extending atop a first portion of the first well region;
a thick field dielectric layer positioned atop a second portion of the first well region between the drain region and the thin gate dielectric layer, wherein the thick field dielectric layer is thicker than the thin gate dielectric layer;
a gate positioned atop a first portion of the thin gate dielectric layer near the source region side;
a field plate overlying at least a portion of the thick field dielectric layer and extending atop a second portion of the thin gate dielectric layer, wherein the field plate is electrically isolated from the gate by a gap overlying a third portion of the thin gate dielectric layer, and wherein the gap is filled with a dielectric material, and wherein the field plate is electrically coupled to the source region; and
a shallow lightly doped region of the first conductivity type located in the first well region underneath the gap and the third portion of the thin gate dielectric layer.

2. The lateral transistor of claim 1 further comprising a second well region of the first conductivity type surrounding the source region and extending below a portion of the gate.

3. The lateral transistor of claim 2, wherein the first well region extends below the source region side, and wherein the first well region is separated from the source region by the second well region.

4. The lateral transistor of claim 1 further comprising a body contact region of the first conductivity type beside and in contact with the source region.

5. The lateral transistor of claim 1, wherein the shallow lightly doped region is continuously formed in the first well region underneath the gap between the gate and the field plate.

6. The lateral transistor of claim 1, wherein the shallow lightly doped region is discontinuously formed in the first well region underneath the gap between the gate and the field plate.

7. The lateral transistor of claim 1 further comprising:
a first spacer formed on a sidewall of the gate and a second spacer formed on another sidewall of the gate; and
a third spacer formed on a sidewall of the field plate and a fourth spacer formed on another sidewall of the field plate.

8. The lateral transistor of claim 1 further comprising a first lightly-doped region of the second conductivity type beside and in contact with the source region, wherein the first lightly-doped region extends below a portion of the gate.

9. The lateral transistor of 1 further comprising a second lightly-doped region of the second conductivity type beside and in contact with the drain region, wherein the second lightly-doped region extends below a portion of the thick field dielectric layer.

10. The lateral transistor of claim 1 further comprising:
an interlayer dielectric layer coating an entire exposed top surface of the lateral transistor; and
a source electrode atop the interlayer dielectric layer, wherein the source electrode is coupled to the source region and the field plate through a plurality of vias in the interlayer dielectric layer.

* * * * *